(12) United States Patent
Baselmans

(10) Patent No.: US 6,777,139 B2
(45) Date of Patent: Aug. 17, 2004

(54) METHOD OF CALIBRATION OF A LITHOGRAPHIC APPARATUS, MASK FOR USE IN CALIBRATION OF LITHOGRAPHIC APPARATUS, LITHOGRAPHIC APPARATUS, DEVICE MANUFACTURING METHOD, DEVICE MANUFACTURED THEREBY

(75) Inventor: Johannes Jacobus Matheus Baselmans, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 29 days.

(21) Appl. No.: 10/139,625

(22) Filed: May 7, 2002

(65) Prior Publication Data

US 2002/0172876 A1 Nov. 21, 2002

(30) Foreign Application Priority Data

May 8, 2001 (EP) ............................................ 01304122

(51) Int. Cl.⁷ ................................................ G03F 9/00
(52) U.S. Cl. ............................. 430/5; 430/22; 430/30; 250/491.1
(58) Field of Search ................................ 430/5, 22, 30; 257/797; 438/975; 250/491.1

(56) References Cited

FOREIGN PATENT DOCUMENTS

| EP | 0 338 200 | 10/1989 |
|---|---|---|
| EP | 0 534 720 | 3/1993 |

OTHER PUBLICATIONS

Nishihara and Crossley, "Measuring Photolithographic Overlay Accuracy and Critical Dimensions by Correlating Binarized Laplacian of Gaussian Convolutions," *I.E.E.E. Transactions on Pattern Analysis and Machine Intelligence* 10(1):17–30 (1988).

Dirksen et al., "Focus and exposure dose determination using stepper alignment," *SPIE* 2726:799–808 (1996).

*Primary Examiner*—Christopher G. Young
(74) *Attorney, Agent, or Firm*—Pillsbury Winthrop LLP

(57) ABSTRACT

An alignment marker for use in calibration of a lithographic projection apparatus has focus sensitive parts and dose sensitive parts, each of which includes an area having a plurality of dots against a contrasting background forming part of a periodic line structure.

25 Claims, 4 Drawing Sheets

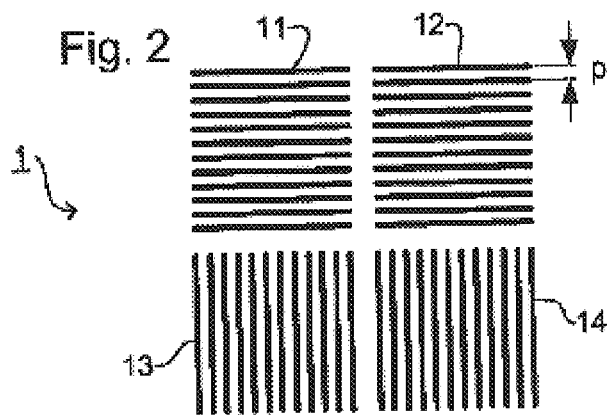
Fig. 2
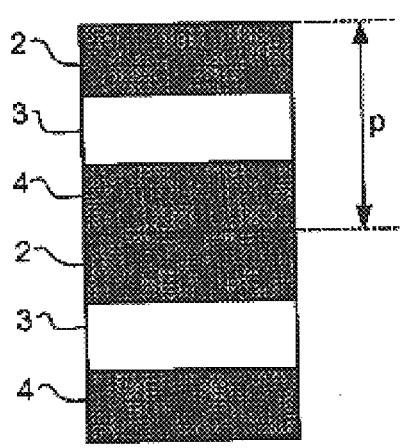
Fig. 3
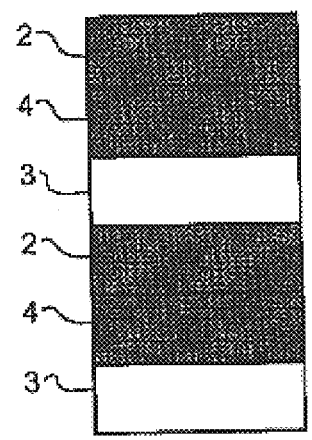
Fig. 4
Fig. 5
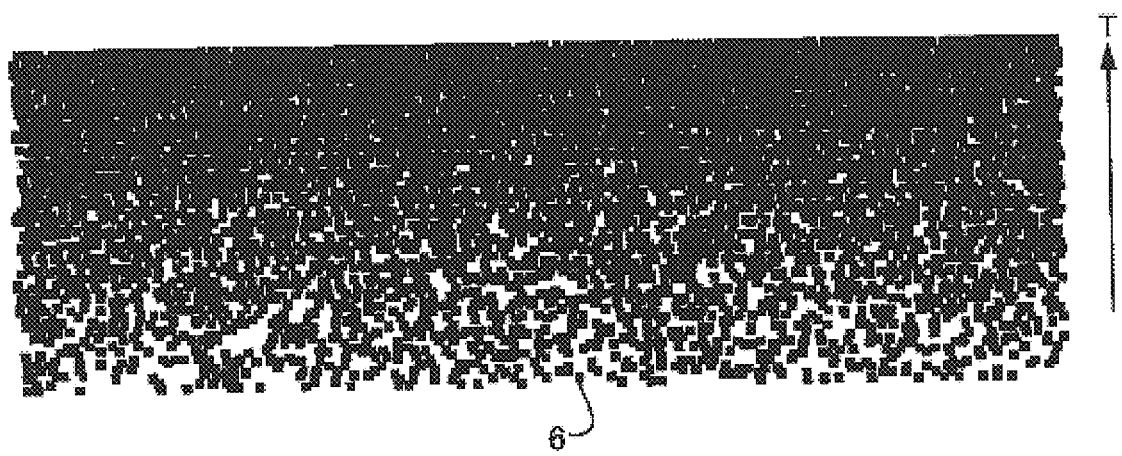

E [mJ/cm²]

- - - - - 40
————  50
———— 60
— — — 70
— · · — 80
— · — · — 90
· · · · · · 110
— — — 130
——— 150

METHOD OF CALIBRATION OF A LITHOGRAPHIC APPARATUS, MASK FOR USE IN CALIBRATION OF LITHOGRAPHIC APPARATUS, LITHOGRAPHIC APPARATUS, DEVICE MANUFACTURING METHOD, DEVICE MANUFACTURED THEREBY

BACKGROUND OF THE INVENTION

1. Field of the Invention

The present invention relates to calibration of lithographic projection apparatus, a mask for use in calibration of lithographic apparatus, a lithographic projection apparatus, a method of manufacturing a device using a lithographic apparatus, and a device manufactured by the method.

2. Description of the Related Art

The term "patterning device" as here employed should be broadly interpreted as referring to a device that can be used to endow an incoming radiation beam with a patterned cross section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix addressable mirrors. The required matrix addressing can be performed using suitable electronics. In both of the situations described above, the patterning device can comprise one or more programmable mirror arrays. More information on mirror arrays as here referred to can be seen, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable as required.

A still further example of a patterning device is a programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device set forth above.

Lithographic projection apparatus can be used, for example, in the manufacture of integrated circuits (ICs). In such manufacturing, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step and scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens." However, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory procedures may be carried out on one or more tables while one or more other tables are being used for exposures. Dual stage lithographic apparatus are described, for example, in U.S. Pat. No. 5,969,441 and U.S. Pat. No. 6,262,796, incorporated herein by reference.

As the critical dimension (CD), i.e. the dimension of a feature or features, such as the gate width of a transistor, in which variations will cause undesirable variation in physical properties of the feature, in lithography shrinks, consistency of focus and exposure dose, both across a substrate and between substrates, becomes increasingly important. Traditionally, steppers used energy sensors to monitor the exposure dose by monitoring the output of the illumination system, and image sensors to probe the aerial image. Optimal settings were determined by "send-ahead wafers" i.e. wafers that are exposed, developed and measured in advance of a production run. In the send-ahead wafers, test structures were exposed in a focus energy matrix (FEM) and the best focus and energy settings were determined from examination of those test structures.

The use of an alignment system to monitor focus has been proposed and an extension of this technique to also measure exposure dose was disclosed in the article "Focus and Exposure Dose Determination using Stepper Alignment" by Peter Dirksen et al, SPIE Vol. 2726/799 (1996). This article describes alignment markers that are modified to form a focus mark and a dose mark. One example of a known alignment mark comprises an array of four phase gratings, two of which have their grating lines aligned in a first direction and the other two having their grating lines perpendicular to the first direction. In the focus mark, the line of the grating is replaced by a chopped structure with a sub-resolution chop linewidth. For example, if the overall grating period is 16 $\mu$m, the chop linewidth may be in the range of 0.7 to 0.25 $\mu$m. In the dose mark, the grating line comprises a transparent part and a part with a transmission of about 0.4.

In the method described by Dirksen, the focus energy matrix is imaged on a substrate with a radiation sensitive layer, but the radiation sensitive layer is not processed. The resulting image is called a "latent image" and is formed by thickness variations as a function of irradiation variations, resulting in phase delay of light diffracted at the mark image. By measuring the position of these modified marks with respect to regular alignment marks, an alignment offset (AO) shows up which is representative of focus and dose errors.

One disadvantage of this method is that the dose calibration must be done in the plane of best focus, because the dose AO is focus sensitive. Therefore, simultaneous calibration of focus and dose is difficult, if not impossible. Another disadvantage is that AO measurements of latent images are not as representative as AO measurements of processed images. For example, the phase delay properties of a latent image depend upon the resist properties and resist thickness, whereas further downstream in the process (i.e. after developing and stripping of the resist) such dependence is absent. Also, latent images producing easily measurable AOs can only be formed in resist layers that are thick with respect to typical processed resist layers, and are overexposed. Consequently, the doses used for the calibration process are not comparable to doses used in actual process steps and so the resulting measurements are not as representative.

The article "Measuring Photolithographic Overlay Accuracy and Critical Dimensions by Correlating Binarized Laplacian of Gaussian Convolutions" by H Keith Nishihara et al, IEEE Transactions on Pattern Analysis and Machine Intelligence vol. 10 no. 1 January 1988, discloses a method of measuring overlay accuracy and variations in critical dimensions using targets of random patterns of small elements at the minimum feature size of the photolithographic process. The markers are printed and observed with a camera. The camera image is then processed to determine alignment. By adding a grid, changes in the size of the imaged elements cause changes in alignment.

SUMMARY OF THE INVENTION

It is an object of the present invention to provide a calibration method that can provide a simultaneous focus and dose calibration more representative of actual processed conditions, whilst using existing alignment tools.

This and other objects are achieved according to the invention in a method of calibrating a lithographic projection apparatus, the apparatus including a radiation system constructed and arranged to supply a projection beam of radiation; a support structure constructed and arranged to support a patterning device, the patterning device constructed and arranged to pattern the projection beam according to a desired pattern; a substrate table to hold a substrate; and a projection system constructed and arranged to project the patterned beam onto a target portion of the substrate, the method including imaging at least one alignment marker provided in the patterning device onto a radiation sensitive layer on a substrate held by said substrate table, the at least one alignment marker including at least one grating and having a focus sensitive part and a dose sensitive part, the focus sensitive part and the dose sensitive part each having a plurality of dots on a contrasting background, the pluralities of dots being arranged such that variations in focus settings and dose settings in the imaging cause shifts in the apparent position of the at least one grating.

The invention also provides a patterning device constructed and arranged to pattern the projection beam in a lithographic projection apparatus according to a desired pattern, the patterning device being useable to project a pattern comprising at least one alignment marker including at least one grating having a focus sensitive part and a dose sensitive part, the focus sensitive part and the dose sensitive part each having a plurality of dots on a contrasting background, the pluralities of dots being arranged such that variations in focus settings and dose settings when projecting an image of the at least one alignment marker cause shifts in the apparent position of the at least one grating.

Preferably, the at least one alignment marker imaged on the radiation sensitive layer on the substrate is then developed and its position measured to provide alignment offsets which are representative of focus errors and dose delivered at substrate level. The position of the at least one alignment marker can be measured with a known alignment tool, providing reliable and consistent results. A complete calibration of the focus and dose settings of the apparatus can be obtained by imaging and developing a FEM whereby a plurality of images of the at least one alignment marker are imaged at different dose settings and focus settings in an array. The invention further provides a second stage to the calibration process whereby dose settings and focus settings of the apparatus are selected, with the focus setting displaced from a best focus position, and the at least one alignment marker is then imaged at a plurality of different positions on a substrate so as to provide full X–Y calibration of focus and dose for the apparatus, where the X and Y directions are substantially parallel to the plane of the substrate.

With the invention, focus and dose can be calibrated using a plurality of exposures of the at least one alignment marker on a single wafer and at focus and dose settings more applicable to those used in actual processes.

According to a further aspect of the invention there is provided a method of manufacturing a device using a lithographic apparatus, the method including providing a substrate that is at least partially covered by a layer of radiation-sensitive material; providing a projection beam of radiation using a radiation system; patterning the projection beam with a pattern in its cross-section; and projecting the patterned beam of radiation onto a target area of the layer of radiation-sensitive material, wherein the apparatus is first subjected to a focus and dose calibration as described above, and the results of that calibration are subsequently used in determining focus settings and dose settings employed in the projecting.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

BRIEF DESCRIPTION OF THE DRAWINGS

Embodiments of the invention will now be described, by way of example only, with reference to the accompanying schematic drawings in which:

FIG. 2 shows a modified alignment marker according to a first embodiment of the present invention;

FIG. 3 is an enlarged view of a part of the line structure of the alignment marker of FIG. 2;

FIG. 4 is an enlarged view of another part of the line structure of the alignment marker of FIG. 2;

FIG. 5 is an enlarged view of a semi-transparent area in the line structure of the alignment marker of FIG. 2;

In the Figures, corresponding reference symbols indicate corresponding parts.

DETAILED DESCRIPTION

Figure 1:
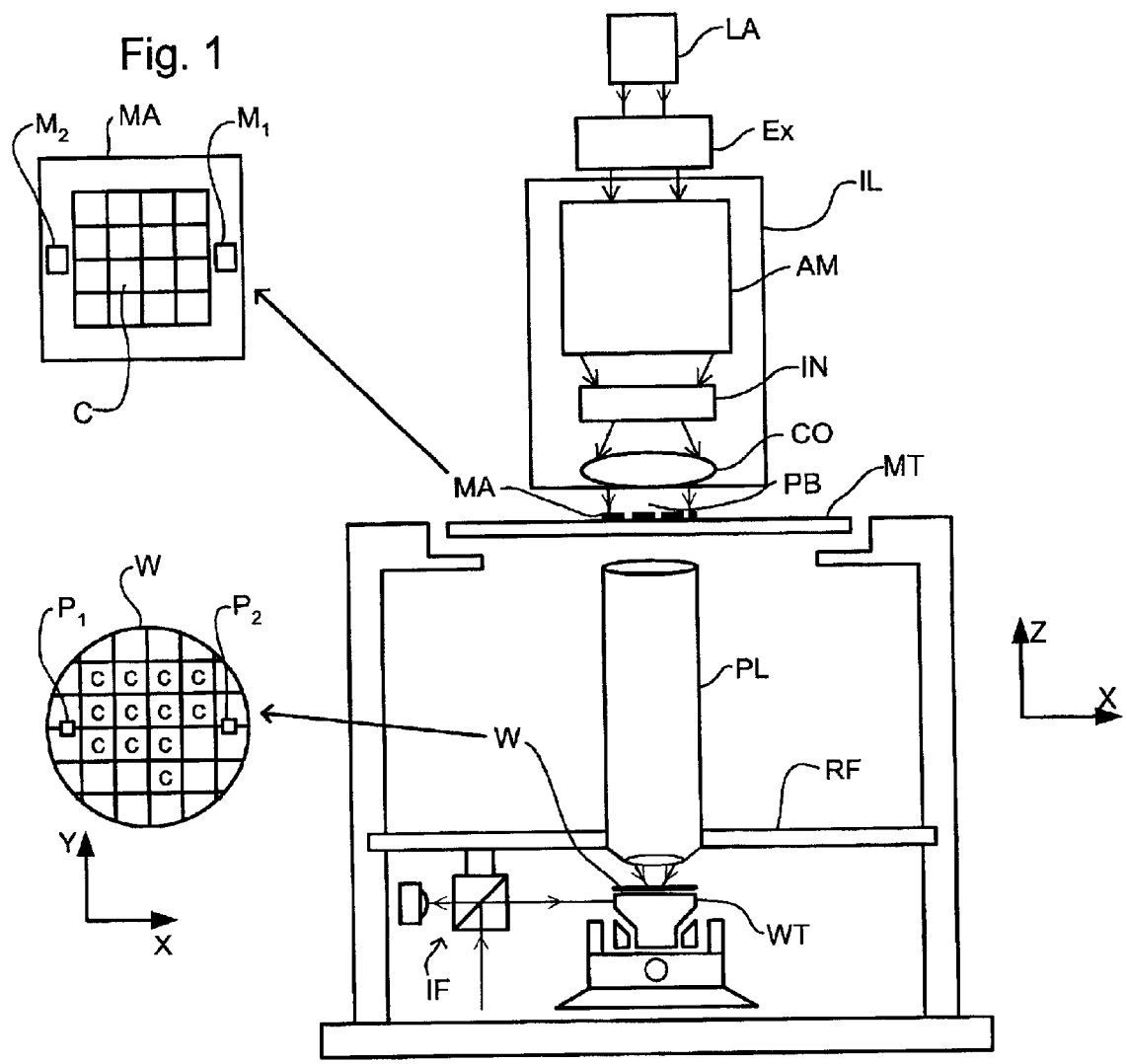
FIG. 1 depicts a lithographic projection apparatus according to an embodiment of the invention.

FIG. 1 schematically depicts a lithographic projection apparatus according to a particular embodiment of the invention. The apparatus a radiation system, Ex, IL, to supply a projection beam PB of radiation (e.g. UV radiation). The apparatus also includes a radiation source LA, a first object table (mask table) MT provided with a mask holder to hold a mask MA (e.g. a reticle), and connected to first positioning devices $M_1$ and $M_2$ for accurately positioning the mask MA with respect to a projection system PL supported by reference frame RF; a second object table (substrate table) WT provided with a substrate holder for holding a substrate W (e.g. a resist-coated silicon wafer), and connected to second positioning devices $P_1$ and $P_2$ for accurately positioning the substrate with respect to the projection system PL; the projection system (lens) PL (e.g. a refractive lens system) constructed and arranged to image an irradiated portion of the mask MA onto a target portion C (comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning device, such as a programmable mirror array of a type as referred to above.

The source LA (e.g. an excimer laser) produces a beam of radiation. This beam is fed into an illumination system (illuminator) IL, either directly or after being passed through conditioning device, such as a beam expander Ex, for example. The illuminator IL comprises adjusting device AM for setting the outer and/or inner radial extent (commonly referred to as σ-outer and σ-inner, respectively) of the intensity distribution in the beam. In addition, it will generally comprise various other components, such as an integrator IN and collimating optics (condenser) CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA which is held in a mask holder on a mask table MT. Having traversed the mask MA, the beam PB passes through the lens PL, which focuses the beam PB onto a target portion C of the substrate W. With the aid of the second positioning devices $P_1$ and $P_2$ (and interferometer IF), the substrate table WT can be moved accurately, e.g. so as to position different target portions C in the path of the beam PB. Similarly, the first positioning devices $M_1$ and $M_2$ can be used to accurately position the mask MA with respect to the path of the beam PB, e.g. after mechanical retrieval of the mask MA from a mask library, or during a scan. In general, movement of the object tables MT, WT will be realized with the aid of a long stroke module (coarse positioning) and a short stroke module (fine positioning), which are not explicitly depicted in FIG. 1. However, in the case of a wafer stepper (as opposed to a step and scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the lens PL (typically, M=1/4 or 1/5). In this manner, a relatively large target portion C can be exposed, without having to compromise on resolution.

FIG. 2 shows an alignment mark 1 which is provided on a mask, e.g. formed of chromium light blocking areas on a vitreous substrate, and used for calibration according to the calibration method of the present invention. As can be seen in FIG. 2, the alignment mark 1 comprises four quadrants 11, 12, 13, 14 each of which comprises a grating structure. Two of the quadrants 11, 12 have their grating lines aligned in a first direction, horizontal in the figure, and the other two quadrants 13, 14 have their grating lines arranged in the perpendicular direction, vertical in the figure. The grating lines in quadrants 11 and 12 are modified from the standard form to enable measurement of dose variations, whilst those in quadrants 13 and 14 are modified to measure focus variations. It should be noted that the quadrants modified for focus and dose calibration need not be horizontally adjacent as shown, but may also be vertically or diagonally adjacent. Also, the focus sensitive quadrants may be provided in a different alignment marker than the dose sensitive quadrants. Further, it is not always necessary to modify an entire quadrant to be focus or dose sensitive; part of the quadrant may have the standard line structure.

As shown in FIG. 3, which is an enlarged view of part of the line structure of quadrant 11, the grating period p comprises a structure of three lines: a chrome area 2, a clear area 3 and a dose sensitive area 4. As shown in FIG. 4, the line structure of the grating of quadrant 12 contains the same elements, but with the order changed by interchanging the clear area 3 and dose sensitive area 4. The dose sensitive area 4 comprises an area of variable transmissivity, with the transmissivity T increasing monotonically from the chrome area 2 towards the clear area 3. The required transmissivity can be obtained, for example, by a pseudo-random pattern of clear and transparent areas or dots 6 of a size smaller than can be resolved by the projection system and appropriately distributed. Such an arrangement is shown in FIG. 5 in which the black dots represent clear dots in a chromium layer on the mask. Where the wavelength of the projection beam is 248 nm and the numerical aperture of the projection system is 0.6, the size of the dots may be, for example, such as would image as dots of about 0.13 μm diameter on the wafer.

When the quadrants 11 and 12 are imaged on a wafer, the dose received at the wafer will vary across the region of the image of the dose sensitive part 4. At some point across the width of that image, the dose delivered will cross the resist threshold so that the resist will be effectively exposed on the higher transmissivity side of that line and not exposed on the lower transmissivity side. The position of the dividing line will depend upon the effective dose reaching the wafer. When the wafer is processed and developed, the line thickness of the developed alignment marker will depend upon the position of the line between exposed and non-exposed parts of the image of the dose sensitive region and this will result in an apparent shift of position of the alignment marker when its position is measured. Also, because the clear dots are of sub-resolution size, the position of the dividing line will be substantially independent of focus. This alleviates the disadvantage of the prior art dose AO being focus sensitive. By printing a plurality of images of the alignment marker at different energy settings and measuring the resultant alignment offsets, the apparatus can be calibrated by correlating the actual dose delivered at wafer level to the energy settings of the apparatus.

Figure 6:
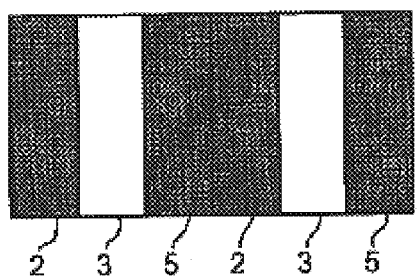
FIG. 6 is an enlarged view of a further part of the line structure of the alignment marker of FIG. 2.
Figure 7:
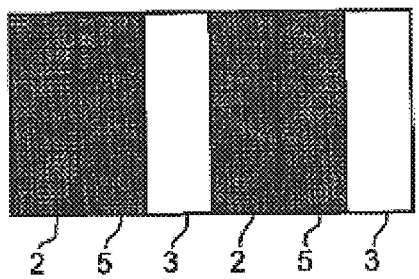
FIG. 7 is an enlarged view of yet a further part of the line structure of the alignment marker of FIG. 2.
Figure 8:
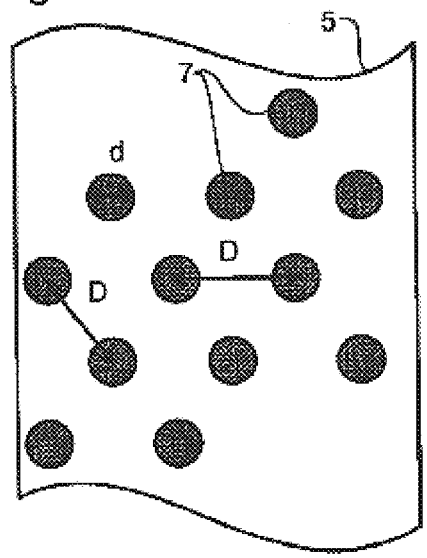
FIG. 8 is an enlarged view of a focus part of the line structure shown in FIGS. 6 and 7.

The line structure of quadrants 13 and 14 of alignment mark 1 again comprises a repeating period of three regions, as shown in FIG. 6 and FIG. 7. The line structure of quadrant 13 comprises a chrome area 2, a clear area 3 and a focus sensitive area 5. The line structure of quadrant 14 is the same, but with the clear area 3 and focus sensitive part 5 interchanged. The structure of the focus sensitive part is shown in more detail in FIG. 8. As can be seen, the focus sensitive area 5 consists of a hexagonal array of chrome dots 7 within an otherwise clear area. The pitch D between dots may, for example, be 1.8 μm, and the dot diameter d may, for example, be 0.6 μm. The FEM imaging, characteristic for the first stage, and the focus marker and dose marker imaging at different X–Y positions, characteristic for the second stage, can also be executed in one single run, i.e. without developing the wafer after the FEM exposure. In this way the focus and dose calibration of alignment offsets and the full X–Y focus and dose calibration can be done in one single step.

When the image of the focus sensitive area 5 on the wafer is correctly focused, the chromium dots 7 will be imaged in the developed resist and will result in a darker area adjacent the printed dark area 2 than would be the case for poorly focused dots, so that there will be an apparent shift in the measured position of the developed alignment marker. As the image of the focus sensitive area 5 moves out of focus the effective diameter of the imaged spots will reduce. Thus the center of gravity of the imaged mask will shift so that an alignment offset is observed. It should be noted that the density of the focus sensitive part must be kept below the threshold at which isofocal behavior occurs. Above that threshold and above a certain energy, no focus sensitive behavior is observed. The density and energy at which isofocal behavior is observed can be calculated or determined experimentally.

To calibrate the apparatus, a two stage process is carried out. In the first stage the dependence of alignment offset of an alignment marker according to the invention on focus and dose is measured experimentally by printing an FEM on the wafer. The FEM comprises a plurality of images of the alignment marker printed with different focus and dose settings of the apparatus. The wafer is then developed and the alignment offset for each of the images of the alignment marker 1 is measured. From the measured dependence of the alignment offsets on focus and dose, two sets of curves, one giving alignment offset as a function of focus, parameterized by dose, and the other giving alignment offset as a function of dose, parameterized by focus, can be generated. The two sets of curves give complete information on the relationship between alignment offset and focus and dose.

In the second stage specific focus and dose values are chosen. The dose is chosen to be typical for the process window of interest and the focus is chosen to be somewhat away from the best focal position, typically the curves for alignment offset as a function of focus take the form of parabolas and the selected focal position is somewhat away from the peak of those parabolas. With the selected dose and focus values, the alignment marker 1 is imaged on a test substrate at a plurality of X–Y positions. The wafer is then developed and complete information on the dependence of alignment offset and dose and focus at different X–Y positions can be determined.

Figure 9:
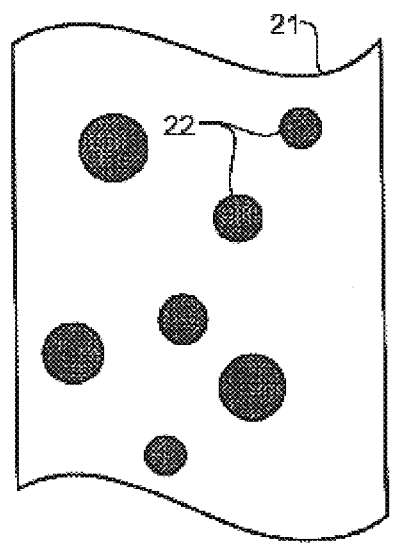
FIGS. 9 and 10 are enlarged views of a semi-transparent part of the line structure of an alignment marker according to a second embodiment of the present invention.
Figure 10:
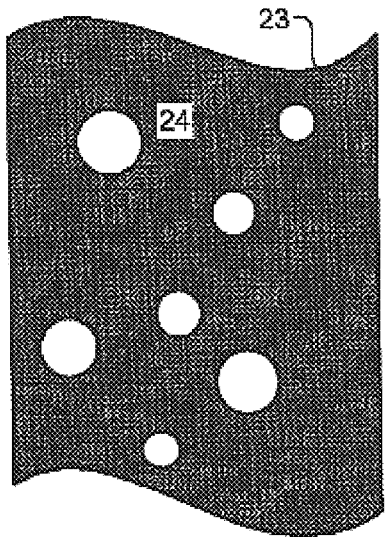

In a second embodiment, the focus sensitive part and the dose sensitive part of the alignment marker are replaced by random patterns of dots and holes as illustrated in FIGS. 9 and 10 to result in an alignment marker which is both focus sensitive and dose sensitive. Specifically, two of the quadrants have a focus sensitive and a dose sensitive part 21, as shown in FIG. 9, which comprises a random array of chromium dots 22 on a clear background. The other two quadrants have a focus sensitive part and a dose sensitive part 23 that includes a random array of holes 24 in a chromium background. Note that whilst the pattern shown in FIG. 10 is the exact negative of the pattern shown in FIG. 9 this need not in practice be the case and the pattern of holes may be entirely different than the pattern of dots. In defining the random pattern of dots or holes, minimum and maximum dot and hole sizes may be specified as well as a minimum separation.

Figure 11:
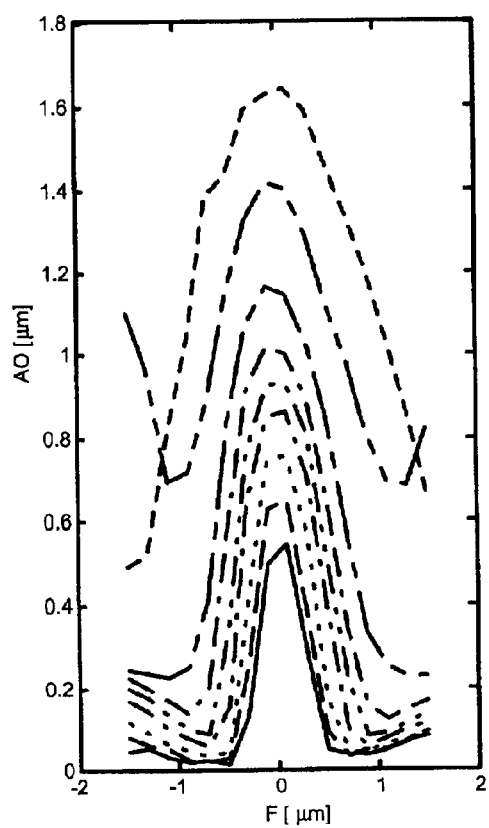
FIGS. 11 and 12 are graphs showing experimental results of measurements of alignment offset at various focus offsets and dose levels for focus and dose marks, respectively, according to the present invention.
Figure 12:
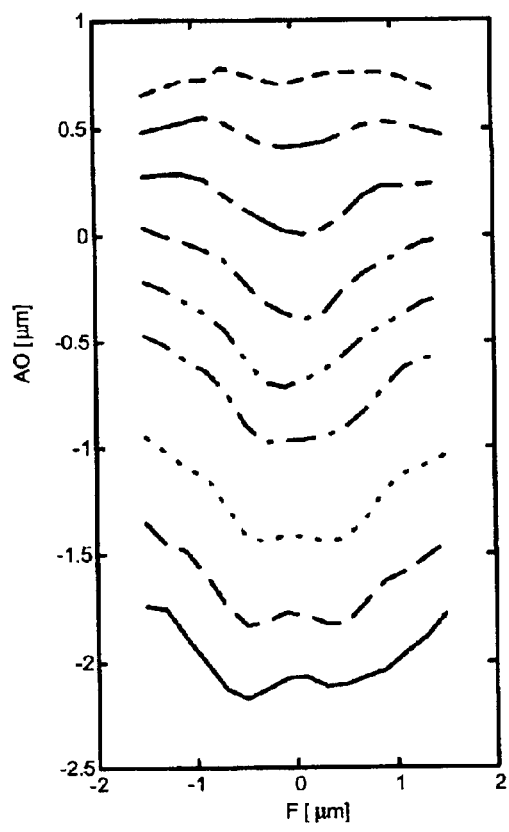

Experimental results deriving from the printing and measurement of a focus energy matrix on a reticle are shown in FIGS. 11 and 12. In the focus energy matrix, the alignment marker of the present invention was exposed at 16 focus steps from −1.5 to +1.5 μm, relative to a nominal zero, and at nine nominal energy levels from 40 to 150 mJ/cm$^2$. FIG. 11 shows the curves relating alignment offset to focus for different energy levels for the focus marker whereas FIG. 12 shows the curves for alignment offset relative to focus for different energy levels for the dose marker. The clearly different focus and dose response shows that the focus and dose can be separately determined.

Whilst specific embodiments of the invention have been described above, it will be appreciated that the invention may be practiced otherwise than as described. The description is not intended to limit the invention. For example, the focus and dose sensitive parts may be incorporated in other types of alignment markers, for example checker-board markers or box-in-box markers for use with a KLA overlay tool.

I claim:

1. A method of calibrating a lithographic projection apparatus, the apparatus comprising:
    a radiation system constructed and arranged to provide a projection beam of radiation;
    a support structure constructed and arranged to support a patterning device, the pattern device constructed and arranged to pattern the projection beam according to a desired pattern;
    a substrate table to hold a substrate;
    a projection system constructed and arranged to image the patterned beam onto a
target portion of the substrate, the method comprising:
    imaging at least one alignment marker provided in the patterning device onto a radiation-sensitive layer on a substrate held by the substrate table, wherein the at least one alignment marker comprises at least one grating and has a focus sensitive part and a dose sensitive part, the focus sensitive part and the dose sensitive part each having a plurality of dots on a contrasting background, the pluralities of dots being arranged such that variations in focus settings and dose settings in the imaging cause shifts in the apparent position of the at least one grating.

2. A method according to claim 1, wherein the at least one grating comprises a plurality of solid lines and the focus sensitive part and the dose sensitive part are arranged adjacent ones of the solid lines, wherein the variations in the focus settings and the dose settings change the apparent widths of the ones of the solid lines.

3. A method according to claim 1, wherein the focus sensitive part comprises a hexagonal array of dots.

4. A method according to claim 3, wherein the focus sensitive part comprises a repeating structure of lines, the lines comprising, in each period of the repeating structure, a substantially opaque line, a substantially transparent line and a line having the hexagonal array.

5. A method according to claim 1, wherein the dose sensitive part comprises a plurality of sub-resolution dots having a size such as to image at a size smaller than the effective resolution of the apparatus and arranged in an area so as to have a density increasing in a first direction across the area.

6. A method according to claim 5, wherein the dose sensitive part comprises a repeating structure of lines, the lines comprising, in each period of the repeating structure, a substantially opaque line, a substantially transparent line and a line having said plurality of sub-resolution dots.

7. A method according to claim 4, wherein the at least one alignment marker comprises first and second focus sensitive parts, the order of lines in the repeating structures being different in the second focus sensitive part than in the first focus sensitive part.

8. A method according t claim 6, wherein the at least one alignment marker comprises first and second dose sensitive parts, the order of lines in the repeating structures being different in the second dose sensitive part than in the first dose sensitive part.

9. A method according to claim 1, wherein in imaging, a plurality of images of the at least one alignment marker are imaged at different dose and focus settings of the apparatus, and further comprising:
    measuring positions of developed images of the plurality of images; and determining from the measured positions the focus and dose characteristics of the apparatus.

10. A method according to claim 2, further comprising:
    selecting a dose setting and a focus setting of the apparatus, the focus setting being displaced from a best focus position;
    imaging the at least one alignment marker at a plurality of different positions on a radiation sensitive layer of a substrate, using the selected dose and focus settings;

measuring the positions of the plurality of images of the at least one alignment marker; and determining from the measured positions any nonconformities with position in the focus and dose characteristics of the apparatus.

11. A method according to claim 10, further comprising:

determining any systematic components of the nonconformities; and adjusting at least one of settings and parameters of the apparatus to reduce or compensate for the systematic components.

12. A method according to claim 10, wherein selecting the dose setting and the focus setting and imaging the at least one alignment marker at the plurality of positions are performed concurrently with imaging the plurality of images of the at least one alignment marker at different dose settings.

13. A method according to claim 10, further comprising:

developing the plurality of images before measuring the positions.

14. A method according to any one of claim 9, wherein in measuring, the position of the images is measured using an alignment system that images selected diffraction orders of light reflected by the images on a reference grating.

15. A patterning device constructed and arranged to pattern a projection beam in a lithographic projection apparatus according to a desired pattern, the patterning device comprising:

at least one alignment marker comprising at least one grating and having a focus sensitive part and a dose sensitive part, the focus sensitive part and the dose sensitive part each having a plurality of dots on a contrasting background, the pluralities of dots being arranged such that variations in focus settings and dose settings when projecting an image of the at least one marker cause shifts in the apparent position of the at least one grating.

16. A patterning device according to claim 15, wherein the focus sensitive part comprises a hexagonal array of dots.

17. A patterning device according to claim 16, wherein the focus sensitive part comprises a repeating structure of lines, the lines comprising, in each period of the repeating structure, a substantially opaque line, a substantially transparent line and a line having said hexagonal array.

18. A patterning device according to claim 15, wherein the dose sensitive part comprises a plurality of sub-resolution dots having a size such as to image at a size smaller than the effective resolution of the lithographic projection apparatus and arranged in an area so as to have a density increasing in a first direction across the area.

19. A patterning device according to claim 17, wherein said dose sensitive part comprises a repeating structure of lines, said lines comprising, in each period of the repeating structure, a substantially opaque line, a substantially transparent line and a line having the plurality of sub-resolution dots.

20. A patterning device according to claim 17, wherein the at least one alignment marker comprises first and second focus sensitive parts, the order of lines in the repeating structure being different in the second focus sensitive parts than in the first focus sensitive parts.

21. A pattering device according to claim 19, wherein the alignment marker comprises first and second dose sensitive parts, the order of lines in the repeating structures being different in the second does sensitive part than in the first dose sensitive part.

22. A patterning device according to claim 15, further comprising a mask table for holding a mask.

23. A lithographic projection apparatus, comprising:

a radiation system constructed and arranged to provide a projection beam of radiation;

a patterning constructed and arranged to pattern the projection beam according to a desired pattern;

a substrate table to hold a substrate;

a projection system constructed and arranged to image the patterned beam onto a target portion of the substrate, wherein the patterning device comprises at least one alignment marker comprising at least one grating and has a focus sensitive part and a dose sensitive part, the focus sensitive part and the dose sensitive part each having a plurality of dots on a contrasting background, the pluralities of dots being arranged such that variations in focus settings and dose settings in imaging cause shifts in an apparent position of the at least one grating.

24. A method of manufacturing a device using a lithographic apparatus, the method comprising:

projecting a patterned beam of radiation onto a target area of a layer of radiation sensitive material at least partially covering a substrate, wherein prior to projecting the patterned beam of radiation the apparatus is calibrated according to the method of claim 1.

25. A device manufactured according to the method of claim 24.

* * * * *